United States Patent

Park et al.

[11] Patent Number: 5,926,435
[45] Date of Patent: Jul. 20, 1999

[54] APPARATUS FOR SAVING POWER CONSUMPTION IN SEMICONDUCTOR MEMORY DEVICES

[75] Inventors: Kee Woo Park; Jong Woo Kim, both of Ichon-shi, Rep. of Korea

[73] Assignee: Hyundai Electronics Industries Co., Ltd., Kyoungki-do, Rep. of Korea

[21] Appl. No.: 09/000,843

[22] Filed: Dec. 30, 1997

[30] Foreign Application Priority Data

Dec. 31, 1996 [KR] Rep. of Korea ............. 96-80217

[51] Int. Cl.⁶ ....................................... G11C 8/00
[52] U.S. Cl. ................... 365/233; 365/189.05; 365/194; 365/230.08
[58] Field of Search .................. 365/189.05, 194, 365/189.06, 230.08, 233

[56] References Cited

U.S. PATENT DOCUMENTS

| | | | |
|---|---|---|---|
| 4,970,687 | 11/1990 | Usami et al. ................. | 365/189.01 |
| 5,226,011 | 7/1993 | Yanagisawa ................. | 365/230.08 |
| 5,379,261 | 1/1995 | Jones, Jr. ................... | 365/230.08 |
| 5,600,606 | 2/1997 | Rao ........................... | 365/233 |
| 5,701,273 | 12/1997 | Choi ........................... | 365/230.08 |
| 5,745,429 | 4/1998 | Cowless et al. ............. | 365/189.05 |

*Primary Examiner*—Son T. Dinh
*Attorney, Agent, or Firm*—Thelen Reid & Priest LLP

[57] ABSTRACT

A power consumption saving apparatus for semiconductor memory devices such as DRAM's, which is configured to preferentially latch a clock signal and a chip selection signal over other input command signals so that latch circuits for latching the input command signals are controlled in accordance with the clock signal and chip selection signal, thereby saving power consumption occurring in input latches not selected. The apparatus includes an input latch as a latch control circuit for preferentially latching a clock signal and a chip selection signal and outputting the latched signals as a control signal for controlling latch circuits.

3 Claims, 5 Drawing Sheets

APPARATUS FOR SAVING POWER CONSUMPTION IN SEMICONDUCTOR MEMORY DEVICES

BACKGROUND OF THE INVENTION

1. Field of the Invention

The present invention relates to an apparatus for saving power consumption in semiconductor memory devices, and more particularly to a power consumption saving apparatus for semiconductor memory devices such as DRAM's, which is configured to preferentially latch a clock signal and a chip selection signal over other input command signals so that latch circuits for latching the input command signals are controlled in accordance with the clock signal and chip selection signal, thereby saving power consumption occurring in input latches not selected while reducing the size of output terminal drivers in a control chip. In particular, the present invention relates to a logic design for a semiconductor device, which is not only adapted to save unnecessary power consumption occurring in the semiconductor device when input command signals are entirely or partially input in sync with a certain signal such as a clock signal and controlled by a chip selection signal, but also adapted to reduce the output terminal driver size of a control chip.

2. Description of the Prior Art

Generally, system configurations using DRAM's include chips adapted to achieve desired control operations and chips adapted to be controlled by those control operations. The former chips are called "control chips" whereas the latter chips are called "DRAM's". An example of such system configurations is illustrated in FIG. 1. As shown in FIG. 1, the system may include a plurality of DRAM's controlled by a single control chip. In such a system, the control chip generates a plurality of command signals to be supplied to all DRAM's. The control chip also generates a chip selection signal to be supplied to a selected DRAM, in order to select the DRAM. In order to apply common signals to all DRAM's, it is required to use external signal paths corresponding in number to a value obtained by multiplying the number of DRAM's by the number of common signals to each DRAM. The common signals are output from the control chip along output lines, respectively. Selection of a desired one of the DRAM's to receive the common signals is determined by the chip selection signal. For example, where the control chip should send certain commands or addresses to a DRAM1, it is required to activate a chip selection signal associated with the DRAM1. Under this condition, external command signals are then applied to the activated DRAM1.

FIG. 2 illustrates the inner configuration of a conventional DRAM. As shown in FIG. 2, each command used in association with the DRAM synchronizes with a clock signal. The DRAM includes input pins to which a variety of signals are applied. At a stage following the input pins or terminals, input buffers are disposed which are coupled to the input pins, respectively. A plurality of input latches are disposed at the stage following the input buffers. Command signals applied to the input latches are synchronized with a clock signal in accordance with strobing operations of the input latches, respectively. The DRAM also includes a command decoder which receives the command signals from the input latches. In the command decoder, the command signals are decoded in accordance with a chip selection signal applied to the command decoder. After the decoding operation, the command decoder generates the resultant decoded signal as an internal command for the DRAM. Thus, command signals are applied to only a desired one of the DRAM's to which a chip selection signal is applied.

In such a system, however, the remaining DRAM's, other than the selected DRAM, are toggled in response to unnecessary command signals. As a result, power consumption increases greatly. Furthermore, this system has a problem in that the control chip thereof has an output stage driver size determined on the basis of not only the number of paths for external signals, but also the number of DRAM's.

SUMMARY OF THE INVENTION

Therefore, an object of the invention is to solve the above-mentioned problems involved in the prior art and to provide a power consumption saving apparatus for semiconductor memory devices, which is configured to preferentially latch a clock signal and a chip selection signal over other input command signals so that input latches adapted to latch the input command signals prior to outputting of those input command signals to the next stage are controlled in accordance with the clock signal and chip selection signal, thereby saving power consumption while reducing the output terminal driver size of a control chip.

In accordance with the present invention, this object is accomplished by providing a power consumption saving apparatus for a semiconductor memory device including at least one DRAM and a control chip adapted to control an operation of the DRAM, comprising: a plurality of input buffers respectively adapted to receive external command signals, a chip selection signal and a clock signal which are generated from the control chip; a plurality of latch means respectively adapted to latch output signals from the input buffers; and latch control means coupled to all the latch means and adapted to receive output signals from those of the input buffers respectively receiving the clock signal and the chip selection signal, thereby generating a control signal for selectively activating the latch means.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 2:
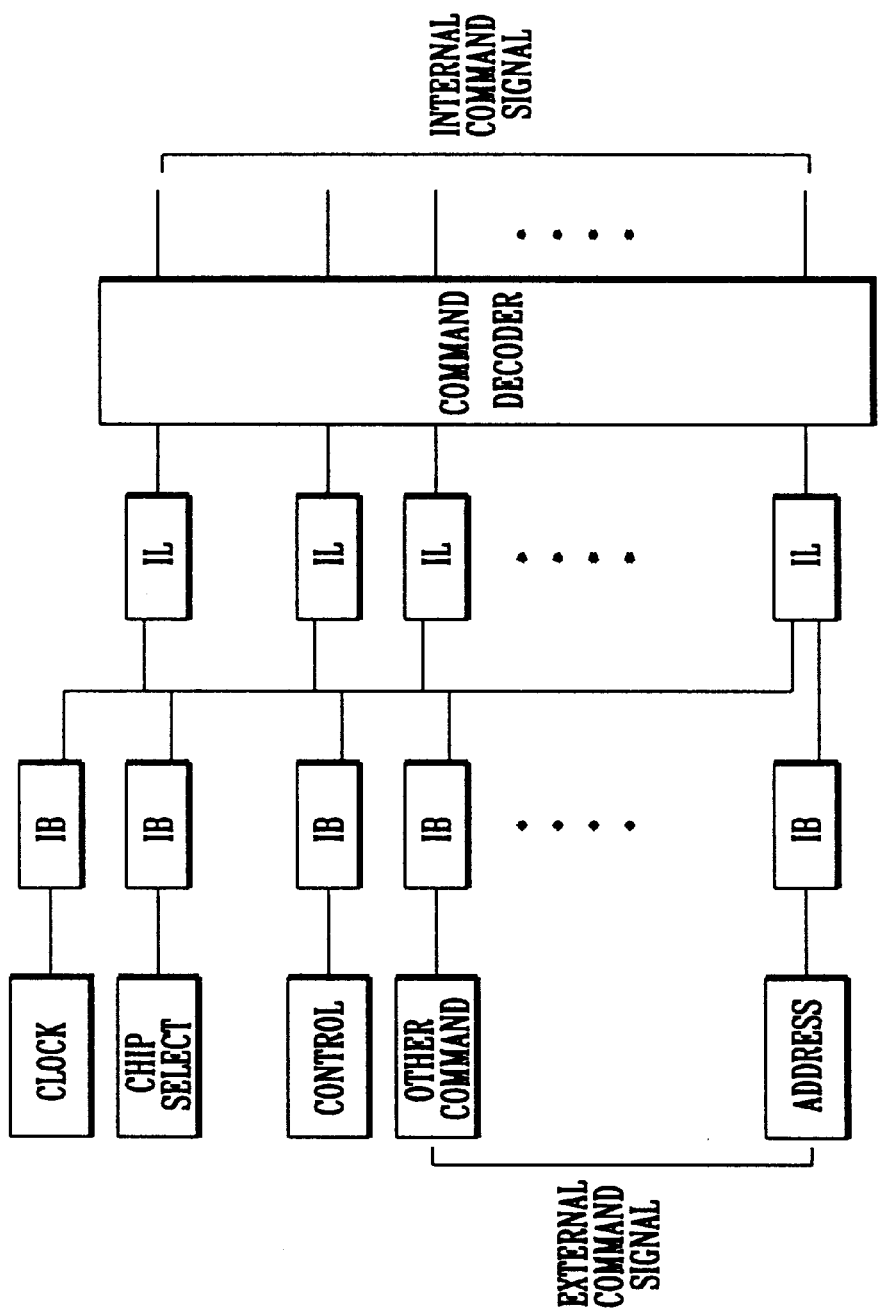
FIG. 2 is a block diagram illustrating the inner configuration of a conventional DRAM.

As mentioned in conjunction with FIG. 2, the toggling operation of input buffers in the conventional system inevitably involves large power consumption. However, it is impossible to modify the stage preceding the input buffers in order to solve the power consumption problem. This is because the input buffers serve to convert external signals into those according to a CMOS logic. However, input latches disposed at the stage following the input buffers can be modified. Meanwhile, large power consumption may occur in paths following the input latches because those paths may have large lengths due to a design used.

Therefore, the present invention provides a configuration in which a clock signal and a chip selection signal are preferentially latched over other input command signals so that they are used to control a latching operation for those input command signals, thereby eliminating a toggling operation of input latches adapted to latch the command signals. This results in a reduction in power consumption.

Figure 3:
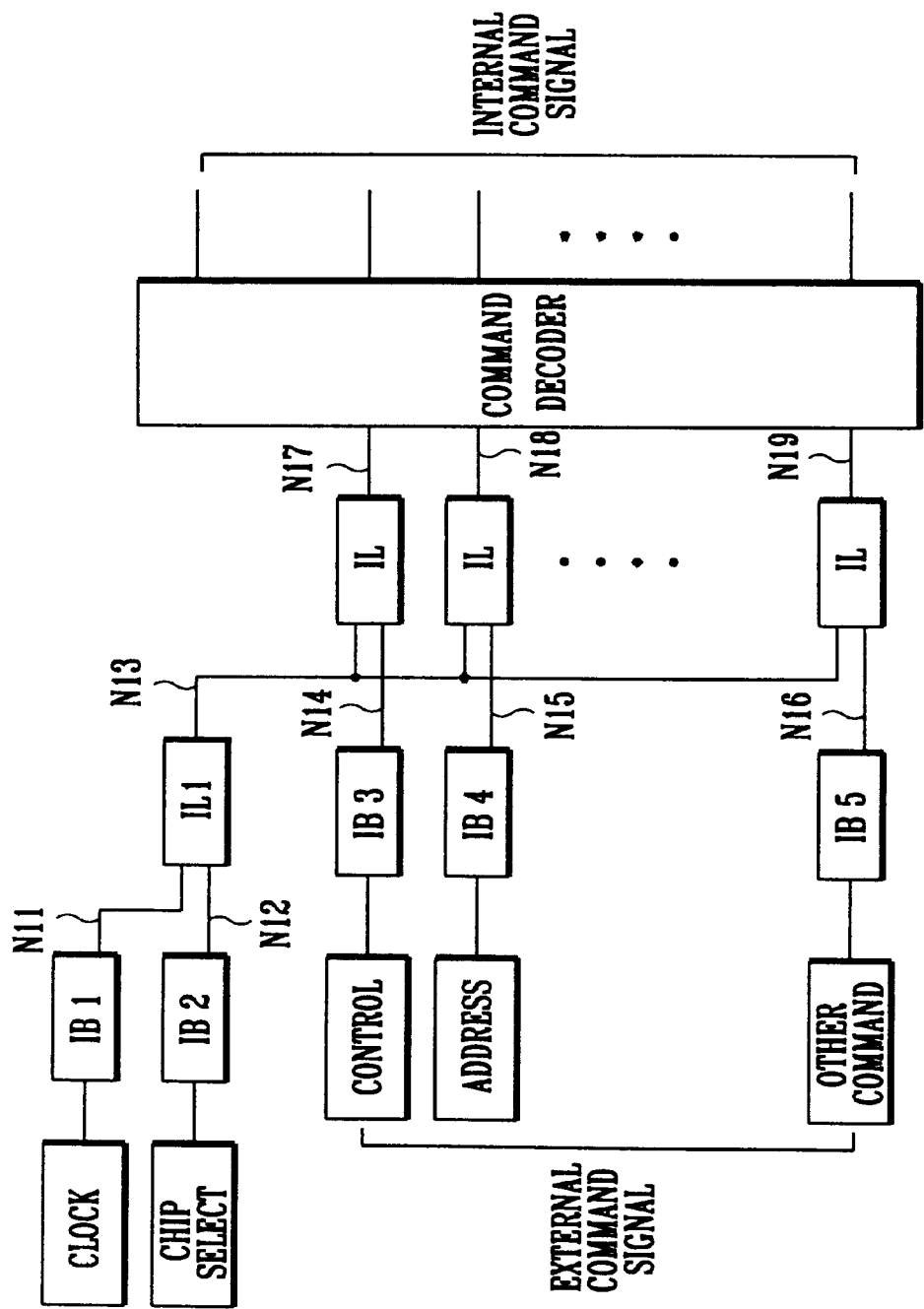
FIG. 3 is a block diagram illustrating the inner logic of a DRAM which is configured to save power consumption according to a first embodiment of the present invention.

FIG. 3 illustrates the inner logic of a DRAM designed in accordance with a first embodiment of the present invention. As shown in FIG. 3, the DRAM includes an input buffer IB1 coupled between a clock signal input terminal and a node N11, another input buffer IB2 coupled between a chip selection signal input terminal and a node N12, and an input latch for receiving and latching signals applied to the nodes N11 and N12 and sending the latched signals to a node N13. The input latch is denoted by the reference numeral 10 in FIG. 3. The DRAM also includes an input buffer IB3 coupled between a control signal input terminal and a node N14, another input buffer IB4 coupled between an address signal input terminal and a node N15, and another input buffer IB5 coupled between another signal input terminal and a node N16. The DRAM further includes a plurality of input latches respectively adapted to latch output signals from the input buffers IB3, IB4 and IB5, and a command decoder adapted to receive output signals from all the input latches, thereby outputting internal command signals.

Figure 1:
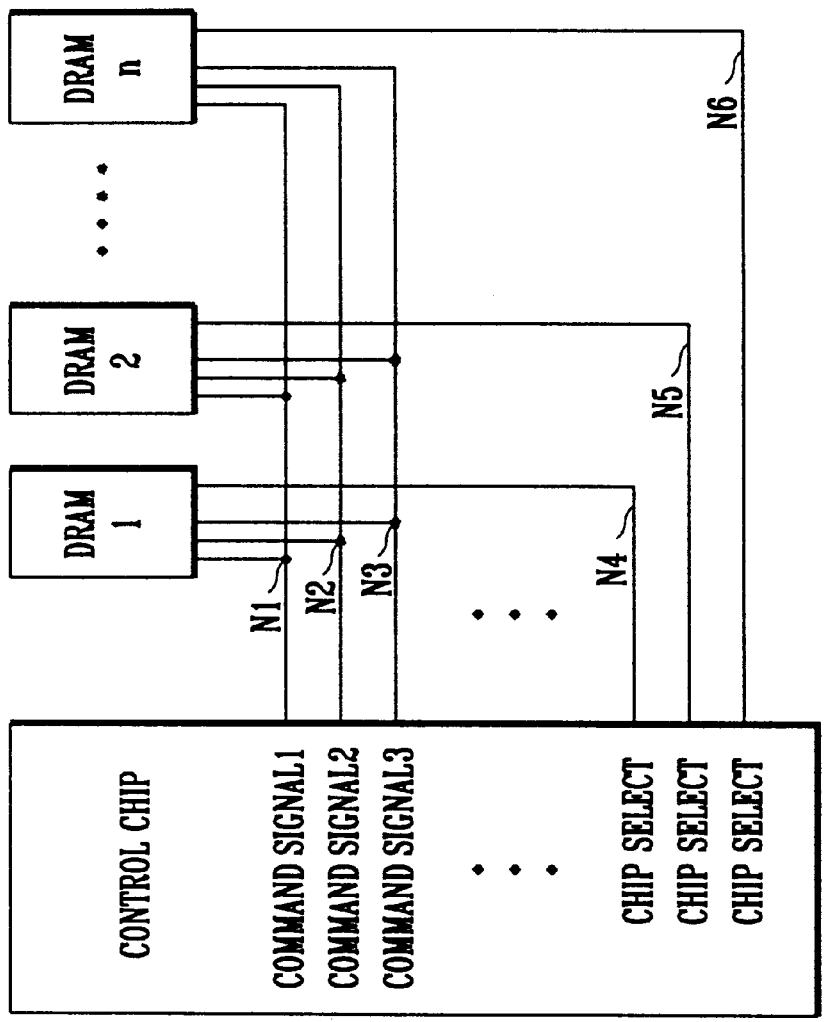
FIG. 1 is a block diagram illustrating a semiconductor memory device which includes a plurality of DRAM's controlled by a control chip.

In accordance with the configuration according to the first embodiment of the present invention, the input latches disposed at the stage following the input latch 10 serving to latch a clock signal and a chip selection signal are activated by an output signal from the input latch 10. Accordingly, it is possible to reduce power consumption. For instance, when the control chip of FIG. 1 selects the DRAM1, it first applies a chip selection signal to the DRAM1 and then applies command signals to all DRAM's. In this case, input buffers of all DRAM's are activated. However, in the case of latches disposed at the stage following the input buffers, only those of the DRAM1 are activated. In other words, the latches of the DRAM's other than the DRAM1 are inactive. Also, the path extending from each inactive latch to the command decoder is inactive. Accordingly, electric power for toggling the latches of unselected DRAM's and the paths disposed at the stage following those latches can be saved.

Figure 4:
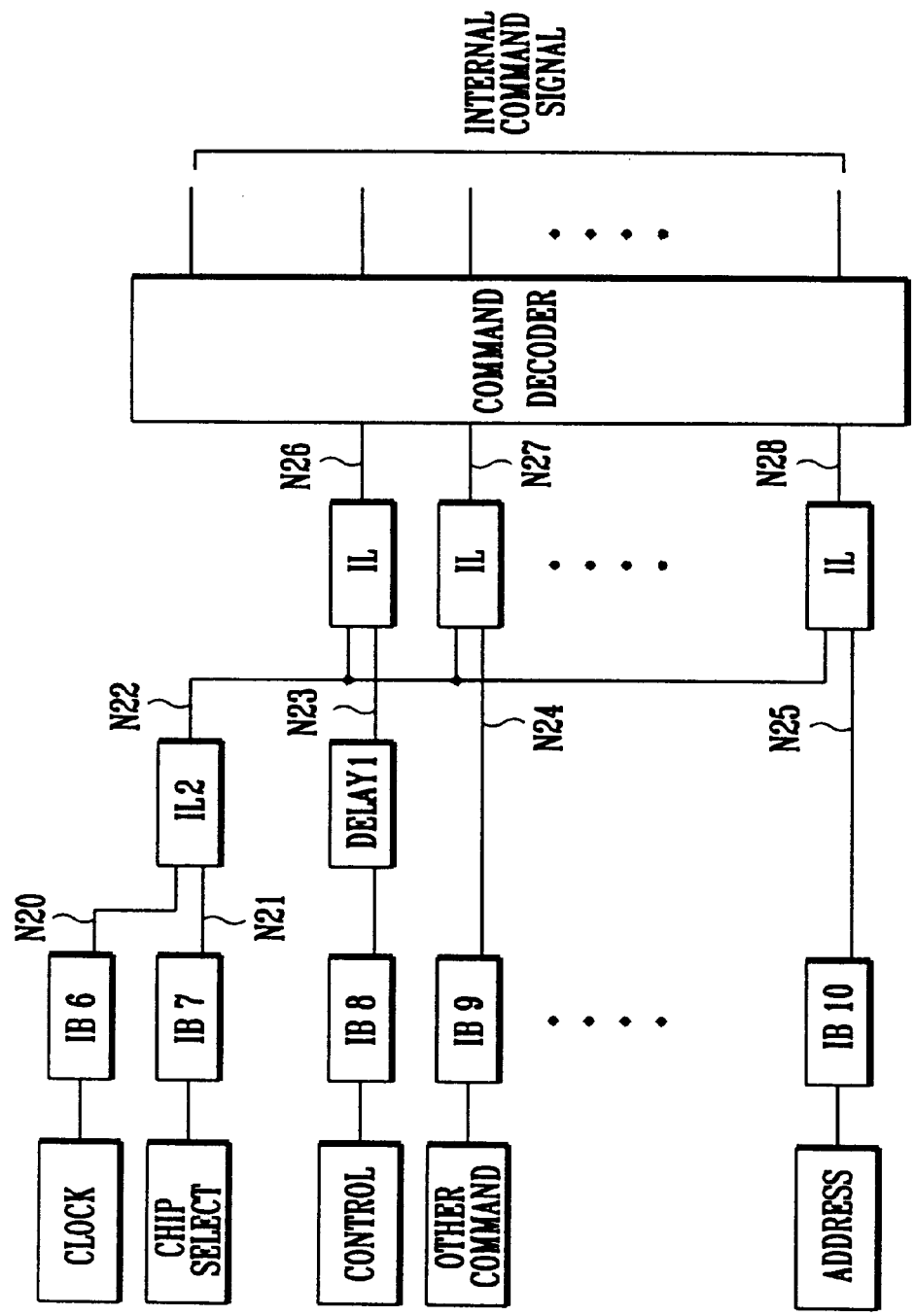
FIG. 4 is a block diagram illustrating the inner logic of a DRAM which is configured to save power consumption according to a second embodiment of the present invention.

FIG. 4 illustrates the inner logic of a DRAM designed in accordance with a second embodiment of the present invention. The DRAM of FIG. 4 has the same basic configuration as that of FIG. 3, except that it includes a delay circuit DELAY1 connected between an input buffer coupled to a control signal input terminal and a node N23. As mentioned above, the conventional system of FIG. 2 include certain buffers (namely, input buffers) each adapted to convert an external command signal input from that of an external logic to that of an internal CMOS logic, and input latches disposed at the stage following the buffers and adapted to synchronize the command signal inputs with a clock signal. In this system, the command signal inputs have a delay approximately the same as the clock signal.

In the configuration of FIG. 4, however, an input latch IL2 is disposed at the stage following input buffers IB6 and IB7 respectively coupled to a clock signal input terminal, in order to latch a clock signal and a chip selection signal. In this case, accordingly, it is necessary to provide a delay circuit for delaying latching of command signals over the clock signal and chip selection signal for one stage. To this end, the DRAM of FIG. 4 includes a delay circuit DELAY1 connected between an input buffer coupled to a control signal input terminal and a node N23.

Figure 5:
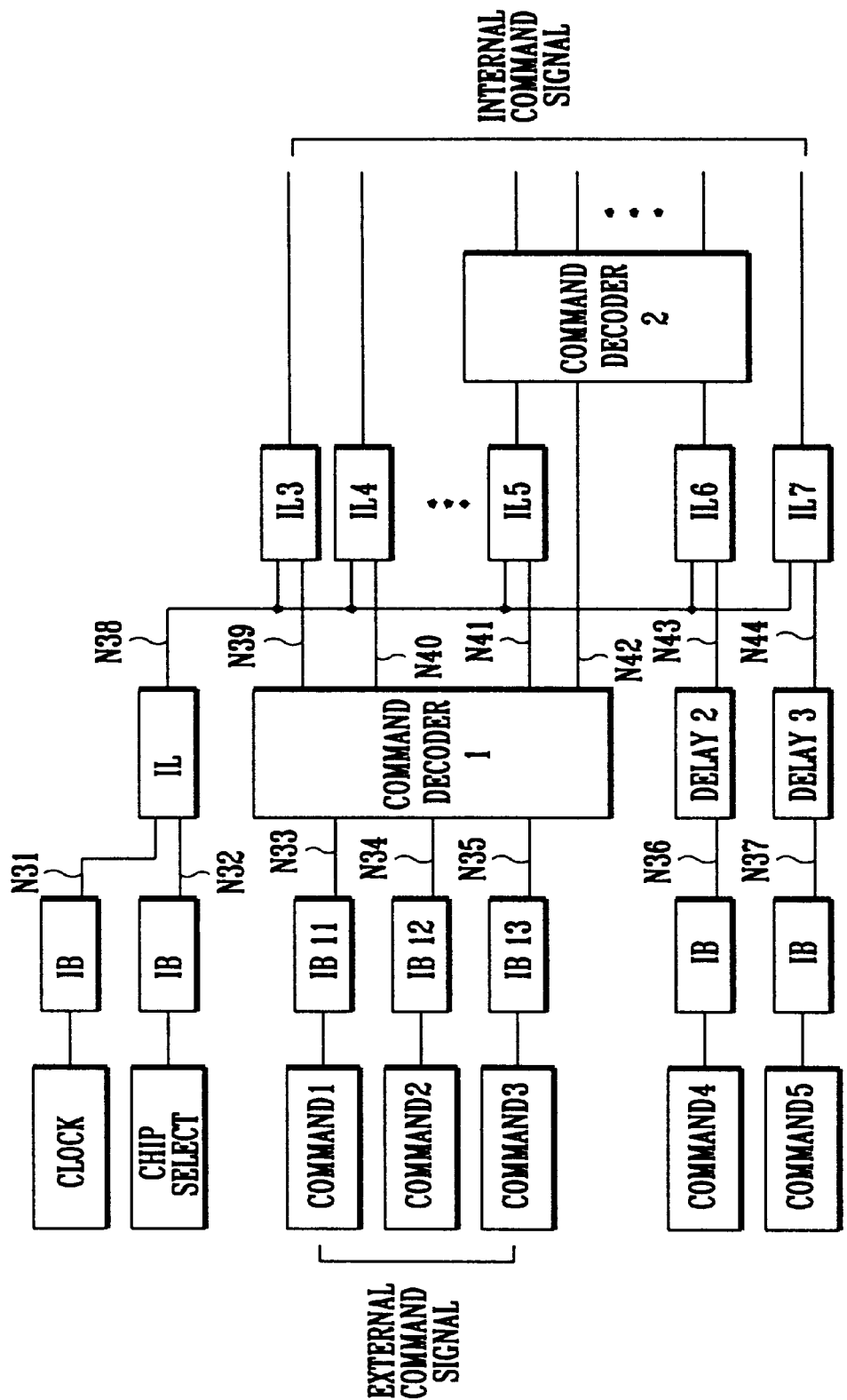
FIG. 5 is a block diagram illustrating the inner logic of a DRAM which is configured to save power consumption according to a third embodiment of the present invention.

FIG. 5 illustrates the inner logic of a DRAM designed in accordance with a third embodiment of the present invention. The DRAM of FIG. 5 has the same basic configuration as that of FIG. 3, except that it includes a command decoder CD1 for receiving output signals from selected input buffers and another command decoder CD2 for receiving selected output signals from the command decoder CD1 along with output signals from input latches controlled by an input latch adapted to latch a clock signal and a chip selection signal. This DRAM is also configured in such a manner that selected command signals are directly used to output associated internal command signals, without being processed by any command decoder.

The input buffers (namely, input buffers IB11, IB12 and IB13) coupled to the command decoder CD1 have a delay approximate to or less than that of input buffers respectively adapted to receive a clock signal and a chip selection signal. In this case, it is possible to achieve a signal transmission involving no influence of delay as in the case of FIG. 3. This is because the command decoder CD1 is disposed at the stage following the input buffers IB11, IB12 and IB13. Where a selected output from the command decoder CD1 is coupled to the command decoder CD2, it is possible to obtain an internal command signal which is delayed as in the case of FIG. 3.

This circuit can be effectively applied to circuits which require not only a signal transmission involving no influence of delay, but also a time difference among command signals. Since selected command signals can also be preferentially decoded in this circuit, there is an advantage in terms of decoding techniques.

As apparent from the above description, in accordance with the present invention, it is possible to reduce power consumption in semiconductor memory devices by appropriately configuring the inner circuit of a chip to be controlled by a control chip. By the appropriately configured inner circuit of the chip, it is also possible to reduce the size of output terminal drivers in the control chip without generating an overload of those output terminal drives.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A power consumption saving apparatus for a semiconductor memory device including at least one DRAM and a control chip adapted to control an operation of the DRAM, the apparatus comprising:

a plurality of input buffers respectively adapted to receive external command signals, a chip selection signal and a clock signal what are generated form the control chip;

a plurality of latch means respectively adapted to latch output signals from the input buffers; and latch control means coupled to all the latch means and adapted to receive output signals from those of the input buffers respectively receiving the clock signal and the chip selection signal, thereby generating a control signal for selectively activating the plurality of latch means when the chip selection signal is activated.

2. The power consumption saving apparatus in accordance with claim 1, wherein;

the control signal from the latch control means is applied to each of the latch means in sync with the external command signals respectively applied to the latch means via the associated input buffers.

3. The power consumption saving apparatus in accordance with claim 2, further comprising:

delay means, coupled between each of the input buffers receiving the external command signals and an associated one of the latch means and adapted to delay an output signal from the input buffer.

\* \* \* \* \*